US006648979B2

(12) United States Patent
Lofaro et al.

(10) Patent No.: US 6,648,979 B2
(45) Date of Patent: Nov. 18, 2003

(54) APPARATUS AND METHOD FOR WAFER CLEANING

(75) Inventors: Michael F. Lofaro, Milton, NY (US); Marc Mattaroccia, New Windsor, NY (US); Leonard C. Stevens, Jr., Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 191 days.

(21) Appl. No.: 09/768,833

(22) Filed: Jan. 24, 2001

(65) Prior Publication Data

US 2002/0096191 A1 Jul. 25, 2002

(51) Int. Cl.[7] .................................................. B08B 7/00
(52) U.S. Cl. ................................. 134/6; 134/2; 134/21; 134/32; 134/44; 134/84; 134/104.2; 451/10; 451/286; 451/288; 451/287; 451/394; 451/331
(58) Field of Search ............................ 134/2, 6, 21, 32, 134/44, 84, 104.2, 137, 140; 451/10, 111, 286, 288, 287, 394, 331

(56) References Cited

U.S. PATENT DOCUMENTS

| | | | |
|---|---|---|---|
| 4,215,283 A | | 7/1980 | Hinds |
| 4,870,306 A | | 9/1989 | Petersen |
| 4,918,869 A | | 4/1990 | Kitta |
| 5,486,129 A | | 1/1996 | Sandhu et al. |
| 5,868,866 A | * | 2/1999 | Maekawa et al. .............. 134/34 |
| 5,935,869 A | | 8/1999 | Huynh et al. |
| 5,947,134 A | | 9/1999 | Kim et al. |
| 6,027,398 A | | 2/2000 | Numoto et al. |
| 6,051,897 A | | 4/2000 | Wissler et al. |

FOREIGN PATENT DOCUMENTS

JP          55114929 A2     9/1980

OTHER PUBLICATIONS

Semiconductor International "CMP Grows in Sophistication" pp. 1–6, Issue, Nov. 1998 Semiconductor International "Copper Moves CMP to Center Stage" pp. 1–9, Issue, Dec. 1999.
John D. Cox, P.E., C.I.H. Executive Vice President and Principal Consultant EnviroBusiness, Inc., Cambridge, MA Input On Environmental Health & Safety Impacts of Semiconductor Fabrication Facility For Incorporation Into EIS For Site in North Greenbush, New York, vol. 3, Appendix 10, pp. 1–26.

* cited by examiner

*Primary Examiner*—Randy Gulakowski
*Assistant Examiner*—Gentle E Winter
(74) *Attorney, Agent, or Firm*—James Cioffi; Cantor Colburn LLP

(57) ABSTRACT

A semiconductor wafer is cleaned while a sponge or brush is pressed against the wafer with a constant forced applied utilizing a bias in a constant force pencil. The wafer is cleaned in the state wherein a collapsing portion of the constant force pencil with respect to the cleaning sponge cloth is set in such a way that the cleaning pressure, which is applied from the cleaning sponge to the wafer, can be constant and is adjustable. A method for cleaning wafers using a constant force pencil is also described.

24 Claims, 8 Drawing Sheets

APPARATUS AND METHOD FOR WAFER CLEANING

BACKGROUND OF THE INVENTION

The present invention relates to the cleaning of wafers. More specifically, the present invention relates to an apparatus and method for the cleaning of wafers post-chemical mechanical planarization (post-CMP) processing using a pencil stylus-like brushcleaner.

Chemical mechanical polishing (CMP) is one of the methods to planarize the patterned semiconductor surfaces, and is also called chemical mechanical planarization. It is the most noticeable technology in the current integrated circuit (IC) process, and is also a key technology for future micro processing. The purpose of this technology is to planarize the dielectric layer or the metal layer on a wafer. In accordance with the design of IC devices toward small size and with multiple layer interconnections, lithography process has a higher limitation on the depth of focus (DOF), and thus has extremely high requirements for the planarization technology. This technology has become even more important for CPU and LOGIC products that have more than three metal layers. Since the polishing process requires that the slurry used have some chemical effect on the wafer surfaces in addition to simply mechanical polishing, this technology is thus named chemical mechanical polishing/planarization. It cannot only reduce the inferior rate of the device products, but also has considerable contribution in the improvement of product reliability.

To improve microprocessor and memory cost/performance ratios as well as increasing factory productivity in semiconductor chip production, manufacturers are finding ways to reduce chip size and add more levels of interconnect wiring. As product design rules are reduced from 0.5 $\mu$m to 0.35 $\mu$m and to 0.25 $\mu$m, lithographic depth of focus (DOF) shrinks from 2.0 $\mu$m to 1.0 $\mu$m to 0.8 $\mu$m. To obtain the largest process window with step and repeat lithography equipment, the entire wafer must be at optimum focus during the exposure. Thus, surfaces must be planar. Consequently, most process development for 0.35 $\mu$m DRAMs or microprocessors requiring more than two levels of metal is incorporating planarization technology.

The residues produced by CMP must be removed prior to subsequent wafer processing, and the removal technique must not be damaging to the wafer. Water washing alone, or brushcleaning with deionized (DI) water is not sufficient for removing residual contaminants. A separate post-CMP cleaning step is required for removal of chemicals and slurry particles from the wafer. This step is typically achieved by mechanical brush cleaning, using a polyvinyl alcohol (PVA) brush or sponge and DI water, or potassium or ammonium hydroxide as the cleaning agent.

A growing number of CMP tools have integrated cleaners and several types of wafer cleaning are utilized at various points in the above-described processes. The type of cleaning process chosen depends on the surfaces being cleaned, and the contaminant(s) being removed (e.g., particulates or film residues such as solvent or photoresist developer residues or metallic films deposited during immersion etching). Ultrasonic scrubbing or mechanical scrubbing can remove insoluble particles. Mechanical scrubbing can be accomplished by a combination of high pressure DI water spraying and brush scrubbing (wherein the rotating PVA sponge or bristle brush makes contact or hydroplanes over the wafer surface).

One problem encountered in polishing or cleaning processes is the non-uniform removal of the semiconductor surface. Removal rate is directly proportional to downward pressure on the wafer, rotational speeds of the platen and wafer, slurry particle density and size, slurry composition, and the effective area of contact between the polishing pad and the wafer surface.

Conventional systems lack control of sponge compression or the pressure applied by a sponge to a wafer when cleaning a wafer post-CMP processing without altering the vertical travel of the arm assembly. In addition, when the conventional scrubbing equipment performs cleaning on wafers the distance between the brush and wafer and, therefore, brush pressure is varied across the wafer due to runout (wobble) of the rotary chuck holding the wafer. Therefore, the conventional scrubbing equipment may damage the semiconductor wafer being cleaned and cannot ensure the effectiveness of cleaning, and time is wasted during each readjustment to obtain the same pressure across the wafer. There thus remains a need for an improved method and apparatus to provide post-CMP cleaning with a sponge maintaining constant pressure independent of the vertical height of an arm assembly that controls a cleaning head in contact with a wafer surface and independent of various mechanical influences of the tool itself. There further remains a need for an apparatus and method that allows for the changing of sponges while maintaining the same pressure on a wafer without readjustment of the arm assembly, as well as the ability to vary the amount of pressure applied to the wafer if so desired.

SUMMARY OF THE INVENTION

The above-described circumstances are overcome and alleviated by the present apparatus and method for cleaning of a semiconductor wafer. The apparatus and method allow for uniform cleaning pressure, which is applied to a wafer by a cleaning sponge, so as to uniformly clean the entire surface of the wafer and also allow for varying the pressure applied, as well as sponge replacement, in a simple manner.

A wafer cleaning apparatus for biasing a cleaning agent with a constant force against a wafer to clean a surface of the wafer, the wafer cleaning apparatus comprising: a carrier for sustaining the wafer against the cleaning agent; a liquid supply for furnishing liquid to the surface of the wafer for cleaning; an end effector holding the cleaning agent and the cleaning agent having a bias towards the wafer; and an arm assembly and a shaft capable of supporting the end effector.

BRIEF DESCRIPTION OF THE DRAWINGS

Referring now to the drawings wherein like elements are numbered alike in the several FIGURES.

DESCRIPTION OF THE PREFERRED EMBODIMENT

Figure 1:
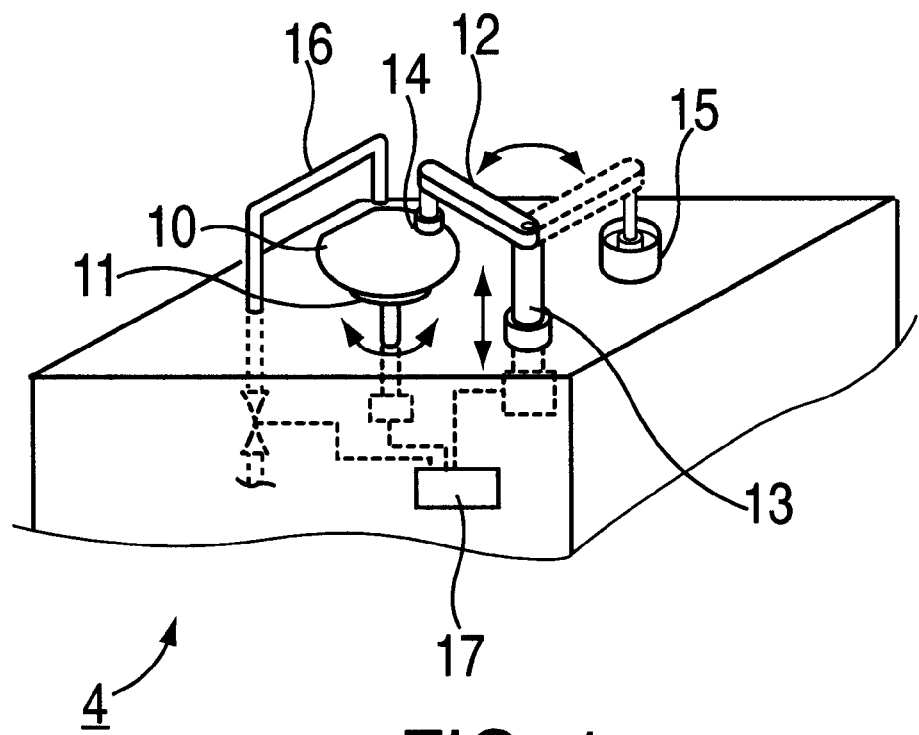
FIG. 1 schematically, depicts a conventional scrubbing equipment for a semiconductor device.

Referring to FIG. 1, a conventional scrubbing equipment 4 includes a rotary chuck 11 on which a semiconductor wafer 10 is placed, a brush arm assembly 12 extending from shaft 13 at a right angle and fixed to the shaft 13 such that brush arm assembly 12 can move up and down and rotate, and a brush 14 made of fluoropolymer resin and provided on one end of the brush arm assembly 12. The brush 14 is housed in a slick cover to conceal the fibers forming the brush 14. In the cleaning step, an operator uses the naked eye to adjust the distance and/or compression between the brush 14 and a wafer to be cleaned, based on the position of the tip of the brush cover.

When the scrubbing equipment is not in use, the brush 14 is typically placed in a pure water container 15 in order to prevent the brush 14 from drying out. A pure water nozzle 16 for pure water supply is provided over the rotary chuck 11. These components are controlled by a micro-controller 17.

Figure 2:
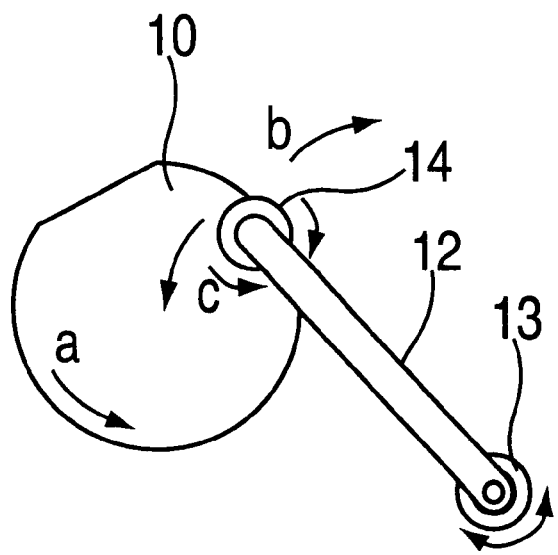
FIG. 2 shows the cleaning operation of a brush of the scrubbing equipment as shown in FIG. 1 moving on a semiconductor wafer rotating on the scrubbing equipment.
Figure 3:
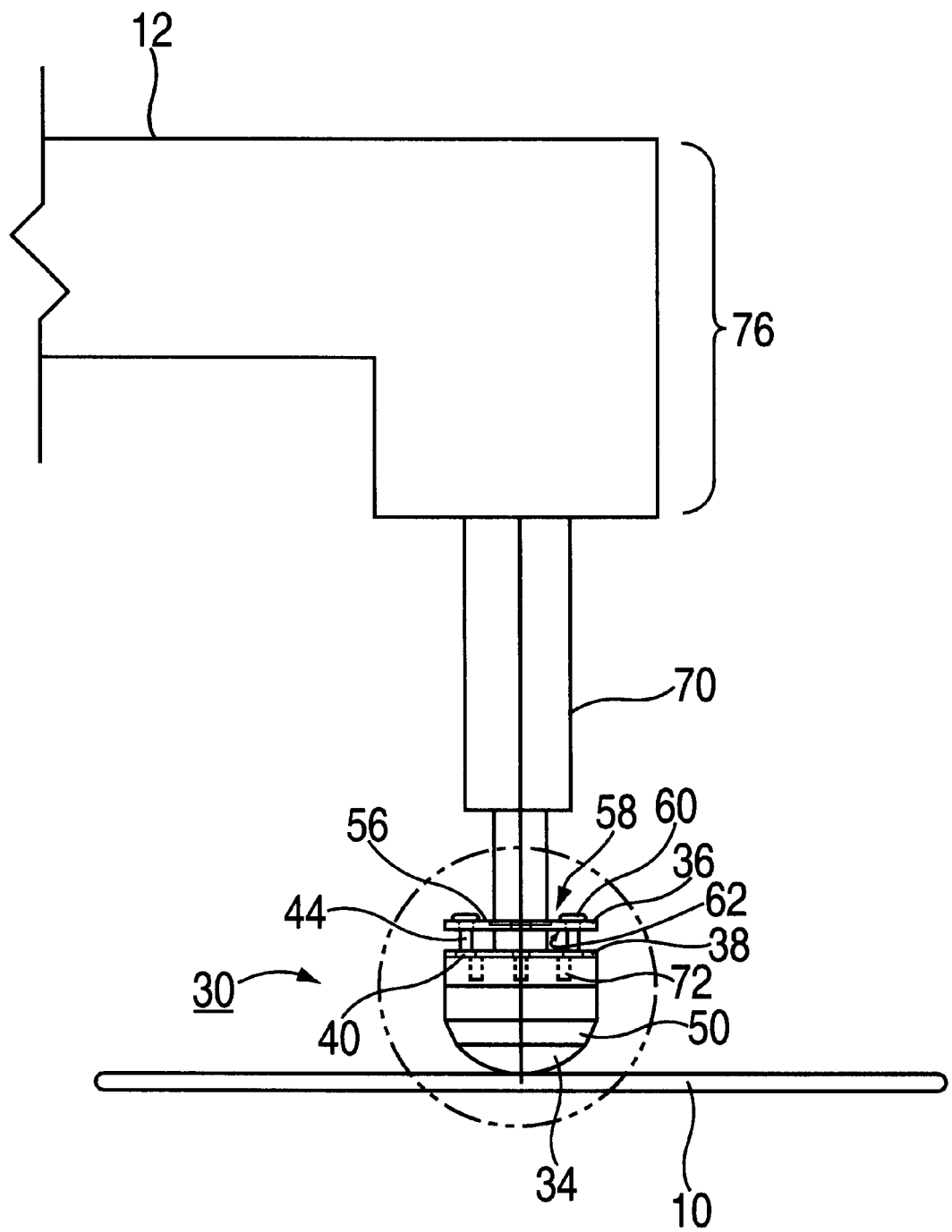
FIG. 3 schematically, depicts a scrubbing equipment for a semiconductor device in accordance with a preferred embodiment of a constant force pencil.
Figure 4:
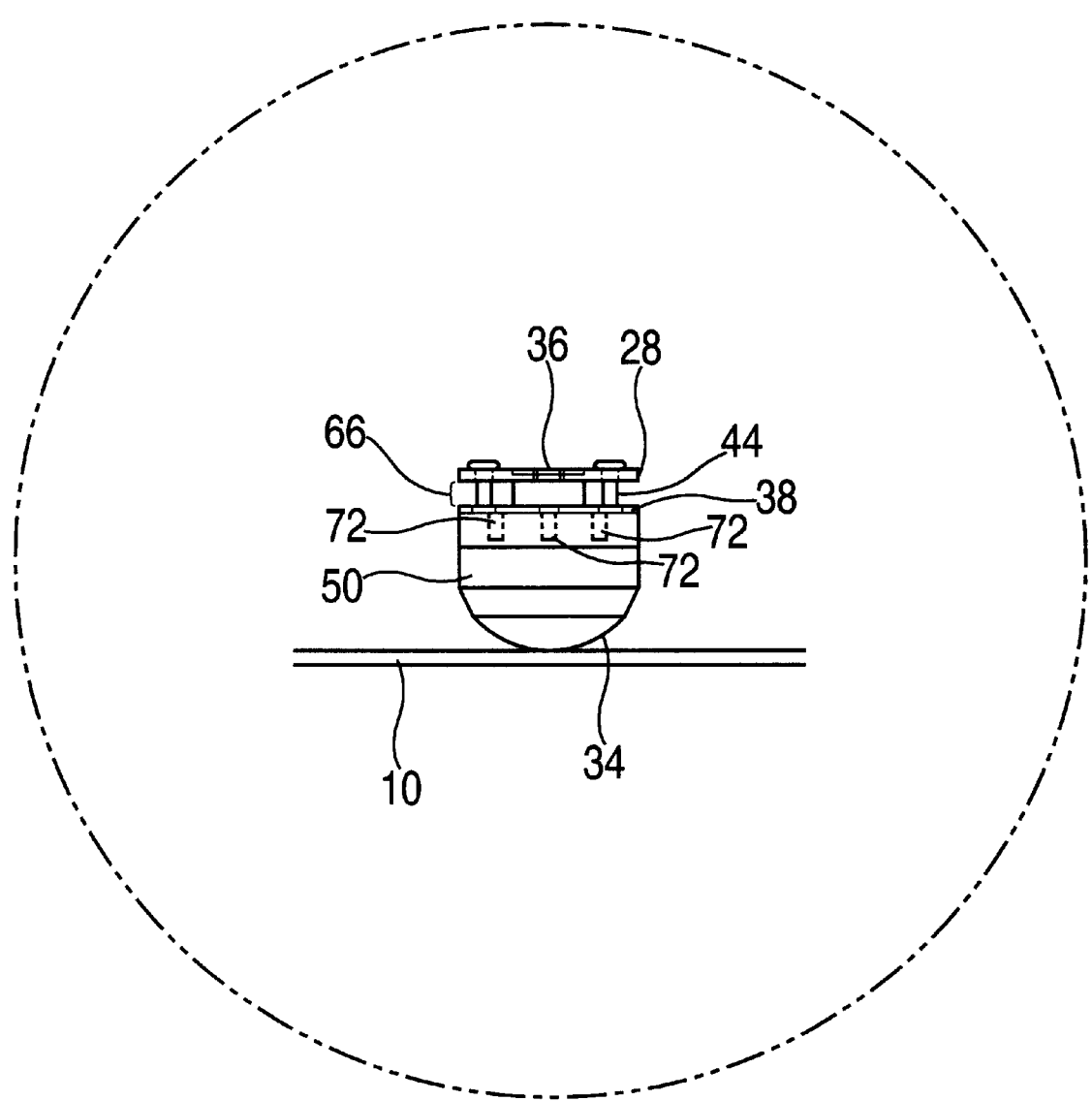
FIG. 4 schematically depicts a constant force pencil apparatus for the scrubbing equipment as shown in Detail A—A in FIG. 3.

Referring to FIG. 2, the operation of the scrubbing equipment 4 will be described as follows. When the scrubbing equipment 4 starts to operate, a semiconductor wafer 10 is placed on the rotary chuck 11 and the rotary chuck 11 starts to rotate. Pure water is sprinkled over the rotating wafer 10. The shaft 13 supporting the brush arm assembly 12 moves up and rotates so that the brush arm assembly 12 also moves up and turns around the shaft 13. Then the brush arm 12 and brush 14 move down until the brush 14 is in contact with the pure water on the wafer 10. As the shaft 13 rotates, the brush arm 12 moves slowly in the direction of the arrow "b" in such a manner that the brush 14 moves parallel to the surface of the wafer for the desired distance. The brush may traverse from edge to edge, edge to center or center to edge.

The pressure created by the brush 14 is important to the above-described scrubbing equipment 4. It is important to maintain the appropriate distance between the wafer 10 and the brush 14. In other words, if the brush is too far from the wafer 10 and does not contact the pure water, the cleaning efficiency is reduced. On the contrary, if the brush is too close to the wafer, and, therefore, brush pressure too high, the brush may damage the wafer.

A current known pencil style brushcleaner makes use of an end effector or sponge holder, i.e., pencil or cleaning head, that is fixed to a rotating shaft. The shaft is fixed to an arm assembly for travel to and from the wafer. Placement of the sponge to the wafer (sponge pressure) is controlled by the vertical travel of the arm assembly and is primarily the result of sponge compression, which is unmeasureable and therefore an unknown quantity. Neither the end effector (pencil), nor the shaft, can be independently adjusted to control the pressure applied to the wafer surface to be cleaned. Furthermore, the rigidity of the entire assembly necessitates an extremely precise setting of the vertical travel for the arm assembly to ensure that the compression of the sponge is correct.

In the conventional scrubbing equipment, since the distance between the brush and a semiconductor wafer to be cleaned is adjusted with the naked eye on the basis of the position of the tip of the brush cover, when a worn-out brush is replaced by a new one, the height at which the brush is set must be readjusted by the operator. Therefore, the conventional scrubbing equipment may damage the semiconductor wafer being cleaned and cannot ensure the effectiveness of cleaning, and time is wasted during each readjustment.

A preferred embodiment of a constant force pencil 30 for cleaning a semiconductor wafer, illustrated in FIGS. 3, 4, 5, and 6 provides a more robust setup procedure, utilizing a biased cleaning agent 34, such as a sponge on a cleaning head 35 having a floating movement. The constant force pencil reduces variability in sponge pressure and provides an apparatus and method by which applied sponge pressure (downforce) is measurable, thereby, improving control and cleaning efficiency. As with the brush 14, the placement the sponge to the wafer 10 (sponge pressure) is controlled by the vertical travel of the arm assembly 12 and is primarily the result of sponge compression, which is unmeasurable and therefore an unknown and unrepeatable quantity in the conventional scrubbing equipment 4 (FIG. 1). Neither the sponge holder (not shown) nor the shaft 13 can be independently adjusted to control the pressure applied to the wafer surface to be cleaned. Because of the rigidity of to ensure the compression of the correct. In addition, the current style of pencil (not shown) that utilizes sponges, allows for very large variations in cleaning performance when sponges are periodically replaced unless a complicated setup procedure is followed to reset the vertical height adjustment of the arm assembly 12 over the wafer 10.

A preferred embodiment includes a cleaning agent 34 disposed above a wafer 10 at one end and depending from a cleaning agent holder 36 at the other. Cleaning agent holder 36 further includes a ledge 38 having three holes 40 equidistantly disposed to slidably engage with three studs 44 having a threads at one end to screw into three holes 46 in an edge 48 of a housing 50 that substantially surrounds cleaning agent holder 36. The three holes 46 in the edge 48 and the three holes 40 in the ledge 38 are aligned with three holes 54 disposed in a holder 56. The holder 56 has a first side 58 that retains three heads 60 at the other end of the corresponding studs 44 from passing through the three holes 54 and a second side 62 wherein a length 66 of the studs 44 extends therefrom. The length of the studs 44 intermediate of the second side 62 of holder 56 and a top portion of the ledge 38 facing the second side 62 represents a maximum floating movement that is the same as length 66 when holder 56 is at a maximum distance from the ledge, limited by the length of studs 44 as will be described below. Furthermore, length 66 is substantially cylindrical and biased towards a maximum length when cleaning agent 34 is not in contact with a wafer 10.

Figure 5:
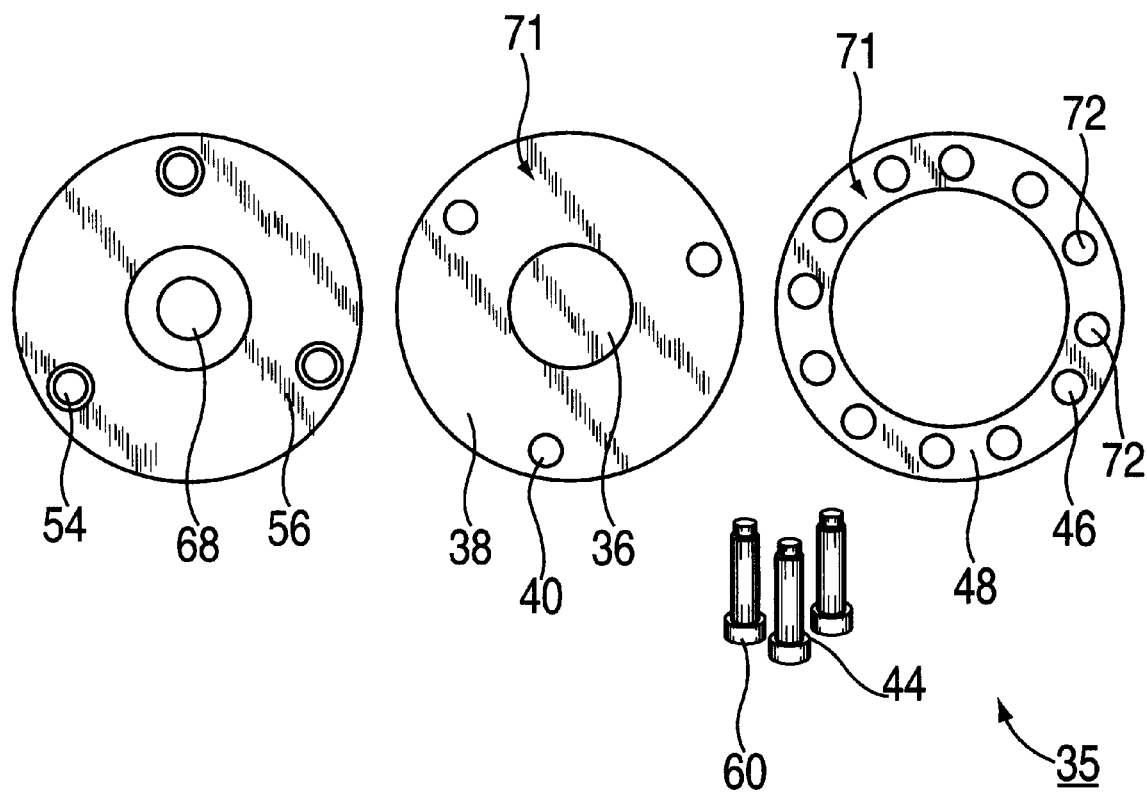
FIG. 5 depicts components of a constant force pencil.

The holder 56 further includes a fixture point 68 that depends to a shaft 70, which in turn depends to an arm assembly 12. In an exemplary embodiment, fixture point 68 has threads disposed therein to receive a matching threaded rotating shaft 70. Ann assembly 12 is movable and adjustable, yet is rigid with respect to shaft and holder once adjusted, thereby movement is allowed only with respect to the floating movement of a base portion 71 of the cleaning head 35 acting against the bias aforementioned (FIG. 5). It will be recognized in the art that base portion may comprise a cleaning agent holder and a plurality of studs in alternative embodiments. Housing 50 includes at least one orifice 72 for receiving weight to alter the bias and hence the force applied to the wafer 10.

Figure 6:
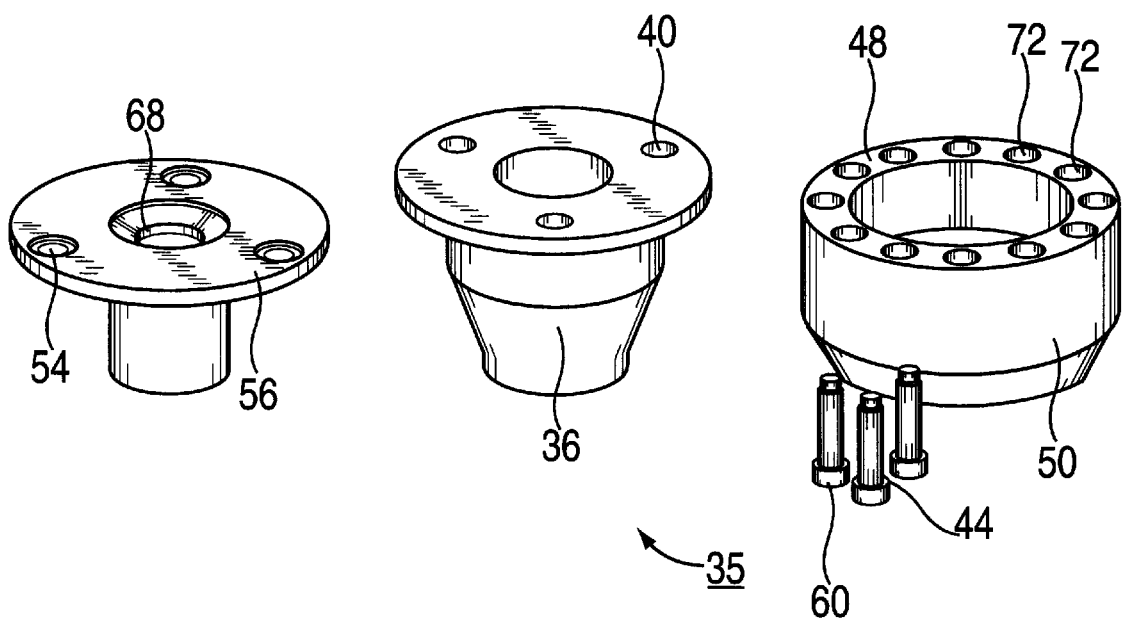
FIG. 6 is a perspective view depicting components of a constant force pencil.

Referring to FIG. 6, an exemplary embodiment of a stud 44 is shown including the head 60 at one end depending from a cylindrical portion 74 that slidably engages with the holes 54 of the holder 56. The cylindrical portion 74 further includes a shoulder 75 disposed at an opposite end disposed to head 60. The shoulder 75 abuts with an outside edge (not shown) substantially defining hole 54 for joining the cleaning agent holder 36 to the housing 50. It will be appreciated that shoulder 75 has a diameter larger than the diameter of the holes 54 in the holder 56 for attaching cleaning agent holder 36 to the housing 50. The shoulder 75 then depends from a threaded portion 76 having a smaller diameter to slidably engage holes 40 of cleaning agent holder 36 and engage the holes 46 of housing 50 for attachment.

Figure 7:
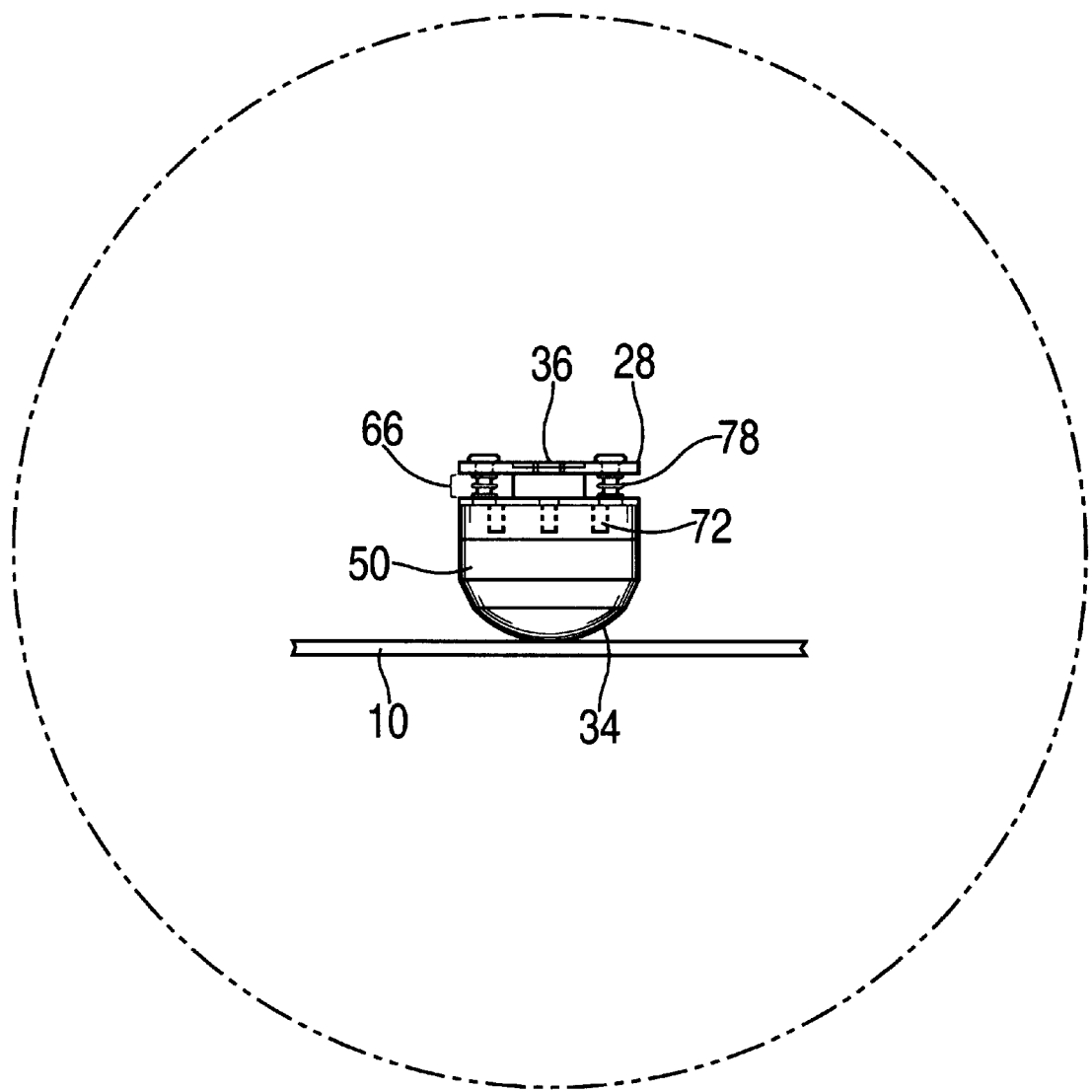
FIG. 7 schematically depicts an alternative embodiment of a constant force pencil in FIG. 4.

In the operation of a constant force pencil 30, a vertical adjustment 78 (FIG. 3) of the arm assembly 12 capable of extending towards a wafer and retracting from a wafer is first made wherein the cleaning agent 34 is brought into contact with a wafer 10 that is sustained on a carrier or a rotary chuck 11 (FIG. 1). As the cleaning agent 34, preferably a sponge, is further extended towards the wafer, the constant force pencil assembly begins to compress against the action of the adjustable bias. The bias in a preferred embodiment results from a combined weight of the base portion 71 comprising; (the housing 50, studs 44, cleaning agent holder 36, and sponge 34) acting against the holder 54 when the heads 60 of the studs 44 are retained on the first side 58 of the holder from further gravitational movement. The maximum movement allowed against this bias is governed by the length 66 of the studs intermediate the second side 62 of the holder and a topside of the cleaning agent holder 36. It will be appreciated by one in the art that an alternative embodiment of the base portion may comprise the studs 44 disposed at one end and the cleaning agent 34 disposed at the opposite end. Furthermore, the bias caused by the weight of the base portion 71 may be altered by adding weight. In preferred embodiments, weight is added to at least one orifice 72 in housing 50. In alternative embodiments, the bias may be obtained with a spring extending from orifice 72 and also with a spring 78 (FIG. 7) disposed about each stud 44 between holder 56 and cleaning agent holder 36.

The down force exerted on the wafer is therefore measurable when the vertical adjustment of the arm assembly is made within the allowable range of motion (floating movement) discussed above by knowledge of the weights or spring forces used to create the bias. Preferably, the vertical adjustment should be set in the midrange of total allowable movement, thus allowing the constant force pencil to apply a constant force in both directions. It should also be readily apparent that utilizing the constant force pencil in this manner eliminates the need for a complicated setup procedure during the periodic replacement of the sponge, thereby eliminating process variability/cleaning performance do to the human factor. Furthermore, utilizing the constant force pencil in the same manner eliminates process variability/ cleaning performance due to varying mechanical performance of the rotary chuck or arm assembly.

Figure 8:
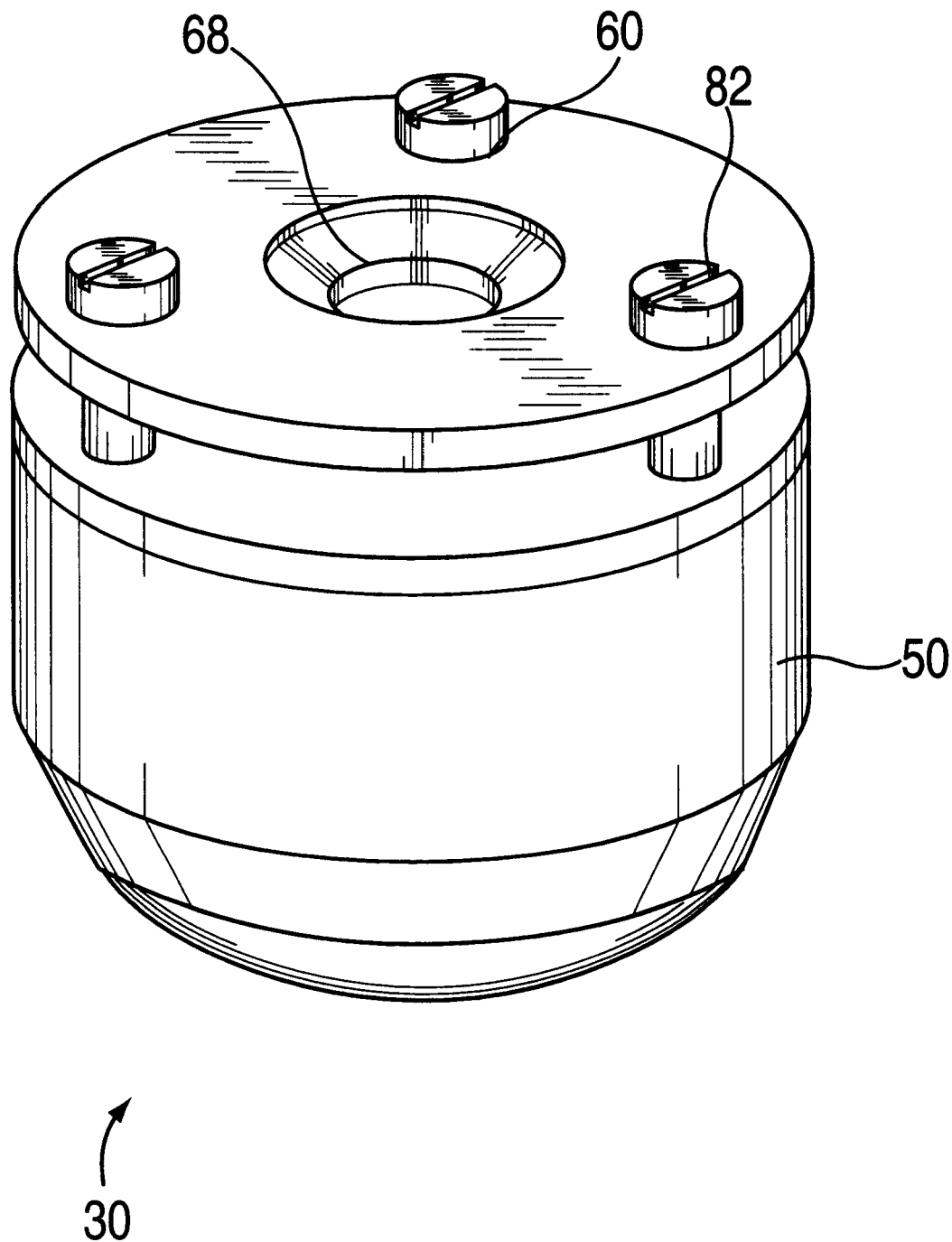
FIG. 8 is a perspective view of a constant force pencil detailing a fixture point.
Figure 9:
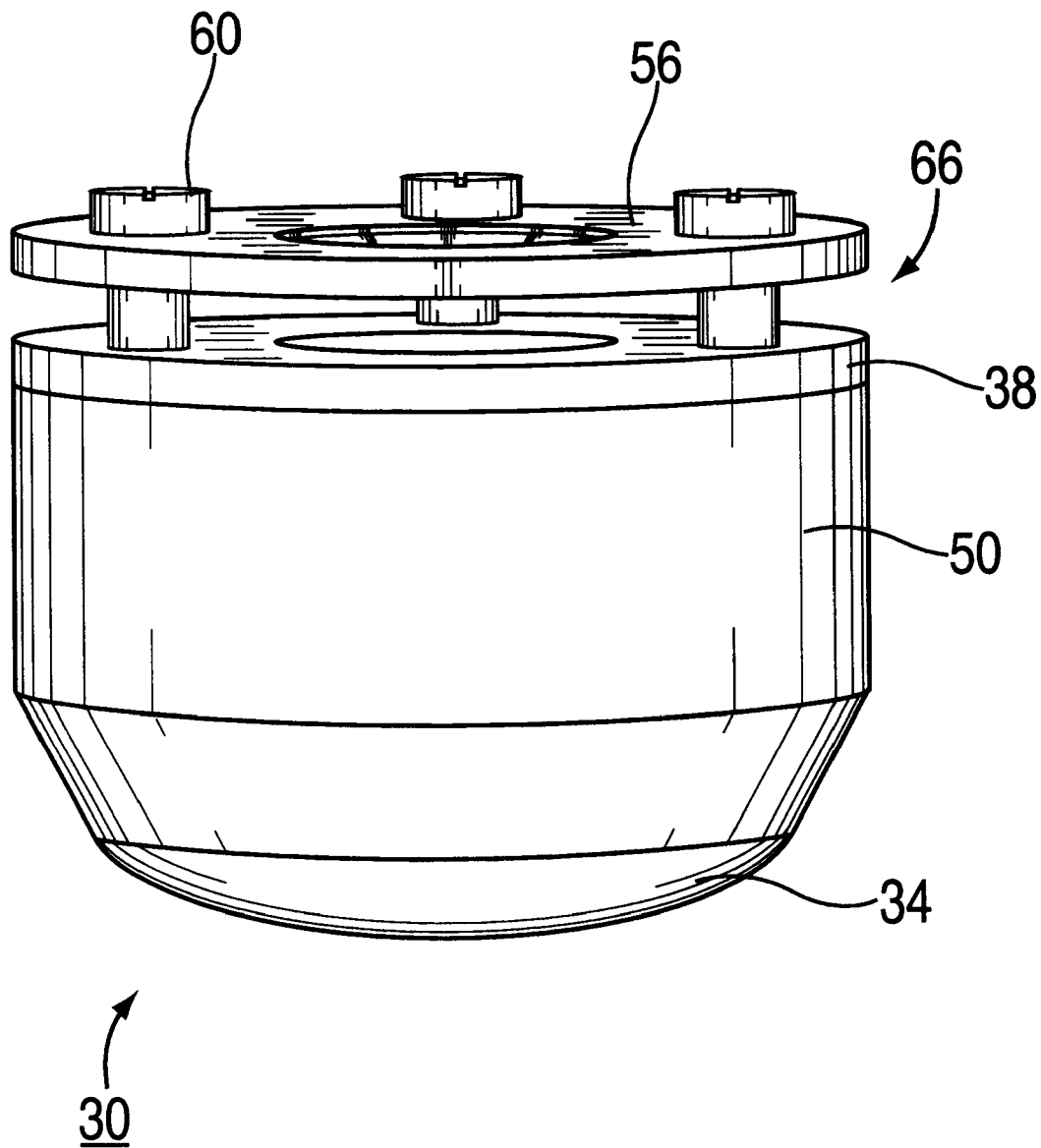
FIG. 9 is a side view of a constant force pencil with a sponge attached.

Referring to FIGS. 8 and 9, a constant force pencil 30 is shown with a sponge affixed to cleaning agent holder 36 and shows a slotted head 82 of stud 44. The slotted head 82 allows removal of the housing 50 with a flat-head screwdriver for further simplifying sponge replacement.

FIG. 9 shows the holder 56 abutting the heads 60 on the first side 58 indicating the maximum length 66 between holder 36 and a top portion of cleaning agent holder 36. During setup, it is preferable that holder 36 is intermediate a bottom portion of head 60 and the top portion of cleaning agent holder 36, such that substantially an equal length of stud 44 is exposed on the first side 58 and second side 62 of holder 36. The aforementioned setup would allow maximum floating movement of the constant force pencil under bias in either direction to compensate for different sponges without a subsequent setup procedure in most cases. The constant force pencil avoids the complicated and sensitive setup procedure by utilization of the floating movement in either direction, and therefore, is a simple and less costly apparatus and method to implement and maintain a constant force when cleaning wafers or when changing sponges.

The operation of the constant force pencil has been described utilizing apparatus that a standard pencil utilizes while avoiding the complicated and sensitive setup procedure. Improved cleaning performance would be expected, however, when considering the possibility of a carrier or arm assembly not being level or if the pencil pressure was not properly set or loosened. The constant force pencil alleviates these concerns.

According to another aspect of a constant force pencil, a method for cleaning a semiconductor wafer is described. The method comprises: providing a wafer cleaning assembly, such as a conventional scrubbing equipment, for cleaning a face of a semiconductor wafer; using a constant applied force for cleaning uniformity, the wafer cleaning assembly including a carrier rotatable about a first axis and capable of holding the wafer, a cleaning head with a cleaning agent including a bias that applies a constant force to the wafer surface and rotatable about a second axis, and a cleaning head displacement arm assembly which moves the cleaning head across the carrier and wafer and has a vertical adjustment to set a height for the cleaning head disposed above the wafer. Furthermore; the method comprises using a liquid supply for furnishing liquid to a surface of the wafer for cleaning; using the wafer cleaning assembly to clean a face of a semiconductor wafer at a cleaning uniformity according to a set of controllable operational parameters that upon variation change the cleaning rate and cleaning uniformity; and using said vertical adjustment to set the height of cleaning head above the wafer such that cleaning agent contacts wafer under said bias within a midrange of the full allowable range of motion to allow floating movement of substantially equal distance in both directions. The method also comprises monitoring in situ at least one of the operational parameters of the wafer cleaning assembly; and adjusting in situ at least one of the operational parameters in response to the control information to effectuate a new cleaning rate and a new cleaning uniformity and then continuing the cleaning of the semiconductor wafer face according to the new cleaning rate and new cleaning uniformity. From the foregoing it will be seen that a method of altering the bias may be accomplished by altering the weight of the cleaning head by adding or eliminating weight from the cleaning head or by using springs to bias the cleaning head towards the wafer surface.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A wafer cleaning apparatus comprising:
   a carrier sustaining a wafer against a cleaning agent, said wafer intermediate said carrier and said cleaning agent;
   a liquid supply furnishing cleaning liquid to a surface of said wafer for cleaning;
   an end effector having a first end and a second end, wherein said end effector includes a cleaning head comprising:
  a holder depending from a shaft, said holder having a plurality of holes;
  a plurality of studs having heads disposed on a first side of said holder, said plurality of studs slidably extending through said plurality of holes and extending on a second side of said holder;
  a base portion having one end coupled to said holder with said plurality of studs, wherein said base portion is biased towards said wafer and allowed to vertically translate to and from said holder, limited by a length of said plurality of studs intermediate of said base portion and said second side of said holder; and
  a cleaning agent extending from an other end of said base portion, said cleaning agent correspondingly allowed to vertically translate with said base portion relative to a support surface sustaining the wafer against said cleaning agent;
said end effector holding said cleaning agent at said first end, said second end having a fixed distance to a surface of said carrier sustaining said wafer, said cleaning agent having a floating movement relative to said surface of said carrier and floating movement perpendicular to said surfaces of said wafer and said carrier, said cleaning agent having a bias towards said wafer that provides a constant force against said wafer independent of the topography of said surface of said wafer, said cleaning agent operably cleans said surface of said wafer in surface contact with said cleaning agent by slidable contact therebetween; and
an arm assembly and a shaft capable of supporting said end effector at said second end.

2. The wafer cleaning apparatus in claim 1, wherein said end effector comprises:
  a holder depending from said shaft, said holder having a plurality of holes;
  a plurality of studs having heads disposed on a first side of said holder, said plurality of studs slidably extending through said plurality of hales and extending on a second side of said holder;
  a base portion having one end coupled to said holder with said plurality a studs, wherein said base portion biased towards said wafer and allowed to vertically translate to and from said holder, limited by a length of said plurality of scuds intermediate of said base portion and said second side of said holder; and
  said cleaning agent extending from an other end of said base portion, said cleaning agent correspondingly allowed to vertically translate with said base portion relative to a support surface sustaining the wafer against said cleaning agent.

3. The wafer cleaning apparatus in claim 2, wherein said base portion comprises:
  a housing having an edge attachable to said plurality of studs; and
  a cleaning agent holder depending to said housing and having a cleaning agent at one end, and at the other end, having a ledge with a plurality of holes aligned with said plurality of holes in said holder, said ledge depending to said edge of said housing.

4. The wafer cleaning apparatus in claim 3, wherein said plurality of studs have a shoulder opposite said head; said shoulder having a diameter larger than a diameter of said plurality of holes on said ledge.

5. The wafer cleaning apparatus in claim 4, wherein said plurality of studs further includes a threaded end opposite said head for attaching to said housing and wherein said shoulder biases said ledge towards said housing.

6. The water cleaning apparatus in claim 1, wherein said cleaning agent is one of a sponge and a brush operably cleaning said wafer.

7. The wafer cleaning apparatus in claim 2, wherein said bias towards said wafer includes a weight of said base portion.

8. The wafer cleaning apparatus in claim 2, wherein said bias towards said wafer includes weight added to said base portion.

9. The wafer cleaning apparatus in claim 2, wherein said bias towards said wafer includes a bias intermediate said holder and said base portion.

10. The wafer cleaning apparatus in claim 2, wherein said bias towards said wafer includes a spring disposed around each said plurality of studs.

11. The wafer cleaning apparatus in claim 3, wherein said housing further includes at least one orifice for receiving one of at least one weight for biasing said cleaning agent towards said wafer.

12. A cleaning head for use in cleaning a semiconductor wafer, the cleaning head comprising:
  a holder depending from a shaft, said holder having a plurality of holes;
  a plurality of studs having heads disposed on a first side of said holder, said plurality of studs slidably extending through said plurality of holes and extending on a second side of said holder;
  a base portion having one end coupled to said bolder wit said plurality of studs, wherein said base portion is biased towards said wafer aid allowed to vertically translate to and from said holder, limited by a length of said plurality of studs intermediate of said base portion and said second side of said holder; and
  a cleaning agent extending from an other end of said base portion, said clawing agent correspondingly allowed to vertically translate with said base portion relative to a support surface sustaining the wafer against said cleaning agent.

13. The cleaning head in claim 12, wherein said base portion comprises:
  a housing having an edge attachable to said plurality of studs; and
  a cleaning agent holder depending to said housing and having a cleaning agent at one end, and at the other end, having a ledge with a plurality of holes aligned with said plurality of holes in said holder, said ledge depending to said edge of said housing.

14. The cleaning head in claim 13, wherein said plurality of studs have a shoulder opposite said head; said shoulder having a diameter larger than a diameter of said plurality of holes on said ledge.

15. The cleaning head in claim 14, wherein said plurality of studs further includes a threaded end opposite said head for attaching to said housing and wherein said shoulder biases said ledge towards said housing.

16. The cleaning head claim 12, wherein said cleaning agent is one of a sponge and a brush for cleaning said wafer.

17. The cleaning head in claim 12, wherein said bias towards said wafer includes weight added to said base portion.

18. The cleaning head in claim 12, wherein said bias towards said wafer includes at least one weight added to said base portion.

19. The cleaning head in claim 12, wherein said bias towards said wafer includes a bias intermediate said holder and said base portion.

20. The cleaning head in claim 12, wherein said bias towards said wafer includes a spring disposed around each said plurality of studs.

21. The cleaning head in claim 13, wherein said housing further includes at least one orifice for receiving one of at least one weight for biasing said cleaning agent towards said wafer.

22. A method for cleaning a semiconductor wafer comprising:

provarding a wafer cleaning assembly for cleaning a surface of a semiconductor wafer;

using a constant applied force for cleaning uniformity, the wafer cleaning assembly including a carrier rotatable about a first axis and holding said wafer, a cleaning head with a cleaning agent having a bias that applies a constant force to said wafer surface and rotating about a second axis;

wherein the cleaning head comprises:

a holder depending from a shaft, said holder having a plurality of holes;

a plurality of studs having heads disposed on a first side of said holder, said plurality of studs slidably extending through said plurality of holes and extending on a second side of said holder;

a base portion having one end coupled to said holder with said plurality of studs, wherein said base portion is biased towards said wafer and allowed to vertically translate to and from said holder, limited by a length of said plurality of studs intermediate of said base portion and said second side of said holder; and a cleaning agent extending from an other end of said base portion, said cleaning agent correspondingly allowed to vertically translate with said base portion relative to a support surface sustaining the wafer against said cleaning agent;

and a cleaning head displacement arm assembly which moves the cleaning head across said carrier and wafer and has a vertical adjustment to set height of cleaning head above wafer;

using a liquid supply for furnishing liquid to said surface of said wafer for cleaning;

using said wafer cleaning assembly to clean said surface of a semiconductor wafer at a cleaning uniformity according to a set of controllable operational parameters that upon variation change cleaning rate and cleaning uniformity;

using said vertical adjustment to set height of cleaning head above wafer such that cleaning agent contacts wafer under the bias within a midrange of a full allowable range;

monitoring in situ at least one of said operational parameters of said wafer cleaning assembly; and adjusting in situ at least one of the operational parameters in response to the control information to effectuate a new cleaning rate and a new cleaning uniformity and then continuing cleaning of said semiconductor wafer surface according to said new cleaning rate and new cleaning uniformity.

23. A method according to claim 22 further comprising varying the bias of said cleaning head by one of adding weight and eliminating weight from said cleaning head.

24. A method according to claim 22 further comprising varying the bias of said cleaning head by using springs to bias cleaning agent towards wafer.

* * * * *